United States Patent
Porter et al.

(10) Patent No.: US 6,355,508 B1
(45) Date of Patent: Mar. 12, 2002

(54) METHOD FOR FORMING ELECTROSTATIC DISCHARGE PROTECTION DEVICE HAVING A GRADED JUNCTION

(75) Inventors: Stephen R. Porter; Manny K. Ma; Stephen Casper; Kevin Duesman, all of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/290,720

(22) Filed: Apr. 12, 1999

Related U.S. Application Data

(62) Division of application No. 09/146,329, filed on Sep. 2, 1998.

(51) Int. Cl.[7] .............................................. H01L 21/332
(52) U.S. Cl. ........................ 438/140; 438/133; 438/570; 257/173; 257/355; 257/452
(58) Field of Search .............................. 438/200, 275, 438/133, 268, 48, 570, 140; 257/173, 452, 355–363; 361/56

(56) References Cited

U.S. PATENT DOCUMENTS

| | | | | |
|---|---|---|---|---|
| 5,477,407 A | * | 12/1995 | Kobayashi et al. | 361/56 |
| 5,521,413 A | * | 5/1996 | Narita | 257/355 |
| 5,559,352 A | | 9/1996 | Hsue et al. | 257/328 |
| 5,563,525 A | * | 10/1996 | Lee | 326/30 |
| 5,777,368 A | | 7/1998 | Wu et al. | 257/360 |
| 5,783,850 A | | 7/1998 | Liau et al. | 257/355 |
| 5,856,693 A | * | 1/1999 | Onishi | 257/336 |
| 5,869,870 A | | 2/1999 | Lin | 257/355 |
| 5,879,967 A | * | 3/1999 | Kim | 438/133 |
| 5,880,501 A | * | 3/1999 | Nagai | 257/355 |
| 5,907,174 A | | 5/1999 | Lee et al. | 257/357 |
| 5,940,721 A | * | 8/1999 | Kinzer et al. | 438/454 |
| 5,963,409 A | * | 10/1999 | Chang | 361/56 |
| 6,207,997 B1 | * | 3/2001 | Jeong et al. | 257/355 |

\* cited by examiner

Primary Examiner—Carl Whitehead, Jr.
Assistant Examiner—Jeff Vockrodt
(74) Attorney, Agent, or Firm—Dorsey & Whitney LLP

(57) ABSTRACT

An electrostatic discharge protection device is formed in a substrate and contains a drain area of a first dopant concentration abutting an extended drain area having a dopant concentration lower than the first dopant concentration. Similarly, a highly doped source area abuts a lower doped source extension area. The source and drain are laterally bounded by oxide regions and covered by an insulation layer. The areas of lower doping prevent charge crowding during an electrostatic discharge event by resistively forcing current though the nearly planer bottom surface of the drain, rather than the curved drain extension. In addition, a highly doped buried layer can abut an area of a graded doping level. By adjusting the doping levels of the graded areas and the buried layers, the substrate breakdown voltage is preselected.

8 Claims, 10 Drawing Sheets

METHOD FOR FORMING ELECTROSTATIC DISCHARGE PROTECTION DEVICE HAVING A GRADED JUNCTION

CROSS-REFERENCE TO RELATED APPLICATION

This application is a divisional of pending U.S. patent application Ser. No. 09/146,329, filed Sep. 2, 1998.

TECHNICAL FIELD

The present invention relates generally to protection circuits for semiconductor devices and, more specifically, to an electrostatic discharge protection circuit having a graded junction for shunting current through a substrate, and a method for forming the protection circuit.

BACKGROUND OF THE INVENTION

An electrostatic discharge (ESD) is a high-stress condition that can destroy integrated circuits. Particularly at risk are Metal Oxide Semiconductor (MOS) circuits, due to the presence of a thin gate oxide. As integrated circuits have decreased in size, gate oxide thickness has also decreased, currently having thicknesses of roughly 100 angstroms. At this thickness, a voltage of only around 10 volts can destroy the oxide during a discharge event. MOS integrated circuits are especially sensitive to damage from an ESD.

An ESD event begins when two areas of the chip are at different potentials and are separated by an insulator. If the potential difference between these two areas becomes large enough, current flows through the insulator in an attempt to equilibrate the charge. This current may destroy the insulative properties of the insulator, rendering the chip inoperative.

ESDs are carried to the integrated circuit through external terminals or pins. The pins of the integrated circuit are normally coupled to the integrated circuit through respective bonding pads formed on the integrated circuit. Therefore, for ESD protection to be effective against externally applied ESDs, the ESD protection should be near the bonding pad. ESD protection circuits are useful not only during operation of the chip, but also when a chip is not secured within an electronic device, such as during installation, or other times when the chip is being handled.

Some areas of the integrated circuit coupled to the pins are more susceptible to damage than others. For example, a ground plane and a Vcc plane within a chip are relatively large and spread out over the majority of the chip. These planes have a large capacitance with respect to the substrate. Consequently, these planes can sink a large amount of current without damage to an insulative layer separating the planes from the substrate. Conversely, each separate DQ circuit, which is coupled to part of the circuit yielding only 1 bit of data, is particularly susceptible to an ESD because the brunt of the ESD is borne by the relatively small output buffer circuitry. Thus, an ESD carried through a pin coupled to one of the DQ circuits is potentially more dangerous to the integrated circuit than an ESD carried through a pin coupled to the ground or Vcc plane.

Some prior art circuits for minimizing or eliminating damage due to an ESD include resistors, serially or parallel connected diodes, silicon controlled rectifiers, or other devices integrated into the substrate of the integrated circuit for limiting the currents of the ESD. One such prior art ESD protection circuit 2 is shown in FIG. 1. An NMOS transistor 4 is formed in a substrate 6 that is biased at a ground potential. The transistor 4 includes a drain 8 connected to an input lead 10 that is coupled through a bonding pad (not shown) to an external terminal or pin of a chip. The bonding pad is also coupled to another circuit on the chip (not shown) that is being protected by the protection circuit 2, such as an output buffer. The transistor 4 also includes a source 12 and a gate 14, both of which are tied to a ground voltage. The gate 14 is separated from the substrate 6 by a gate oxide 18. A pair of field oxide regions 16 separate the protection circuit 2 from the rest of an integrated circuit. If an electrostatic potential difference between the input lead 10 and the substrate 6 becomes greater than a trigger voltage, a discharge between these two areas occurs. Since the chip that includes this protection circuit 2 may be loose, uninstalled, or have no power applied to it, the ground voltage may be at a voltage much higher or much lower than a typical ground voltage of 0 volts. Similarly, the input lead 10 could likewise be at almost any potential, above or below the level of the substrate. The important consideration is not the absolute potential of the input lead 10 and the substrate 6, but rather their potential difference.

Two kinds of ESDs exist, positive and negative. In a negative ESD, the input lead 10 is coupled to a negative voltage of sufficient magnitude with respect to the substrate 6 to trigger an ESD with current flowing from the chip through the input lead 10. Negative ESDs typically do less damage to the chip than positive ESDs. One reason negative ESDs do less damage than positive ESDs is that, during a negative ESD, the MOS transistor 4 turns on because the input lead 10 is more negative with respect to the gate 14 than the threshold voltage of the MOS transistor. Thus, current flows from the grounded source 12, which is acting as a drain, across a channel formed at the top surface of the substrate 6 and into the drain 8, which is acting as a source. Additionally, if the voltage applied to the input lead 10 is lower with respect to the substrate 6 than the turn on voltage of the junction between the substrate and the drain 8, charge will additionally flow directly from the substrate and into the drain. Thus, there are multiple paths available to carry the current flowing from the ground plane to the output terminal during a negative ESD.

During a positive ESD, the MOS transistor 4 does not operate as an MOS transistor, but rather becomes a current conduction mechanism operating like a bipolar NPN transistor. This bipolar transistor is made of the N-type drain 8, the P-type substrate 6 and the N-type source 12, corresponding respectively to a collector, base, and emitter. During a positive ESD event, the voltage applied to the drain 8 increases relative to the substrate 6, thus increasing the reverse bias along the drain 8—substrate 6 junction and increasing a space charge depletion region between these areas. The drain voltage continues to increase until the electric field across the depletion region becomes high enough to induce avalanche breakdown with the generation of electron-hole pairs. Generated electrons are swept through the depletion region and into the drain 8 towards the input lead 10, while generated holes drift through the substrate towards the ground contact. As current flows into the substrate 6, which is resistive, its voltage increases with respect to the source 12. Eventually the substrate potential becomes high enough to forward bias the substrate 6—source 12 junction, causing electrons to be emitted into the substrate from the source 12. Eventually, the NPN transistor is fully turned on with current flowing from the collector to the emitter.

As more current flows through the drain 8, it eventually causes localized heating along portions of the junction of the drain 8 and the substrate 6, especially near the field oxide regions 16. This localized heating can lead to physical breakdown, and eventual circuit inoperability. The curved nature of the drain 8—substrate 6 boundary causes a large electric field to exist at a curved area 20 of the drain. Due to this increased electric field, The current density is higher through the curved area 20 of the drain 8 than other parts of the drain during an ESD event. This effect is called charge crowding. Because of charge crowding, the drain 8 and the substrate 6 break down at the curved area 20 before other areas of the junction between them. This curved area 20 causes the chip to be susceptible to damage at a lower level of ESD than it otherwise would if the curved area 20 was not present. Because positive ESDs do more damage to integrated circuits than negative ESDs, protection circuits are designed to withstand the more dangerous positive ESDs. Thus, the invention will only be described as it relates to positive ESDs.

An additional problem with the prior art circuit 2 of FIG. 1 is that under certain conditions Gate Induced Drain Leakage (GIDL) may occur. GIDL can occur when the N-type drain 8 is at a higher potential than the grounded gate 14 and the grounded P-type substrate 6. Due to the reverse-bias between these areas, a space charge depletion region forms between the drain 8 and substrate 6, and a deep depletion layer exists along the surface of the drain 8 that is below the gate 14. The imparts a large electric field across the gate oxide 18. If the electric field becomes sufficiently large, in addition to a depletion region, an inversion layer will attempt to form at the top surface of the drain. As the holes arrive at the surface to form the inversion layer, they are drawn and are immediately swept cross the space charge depletion region to the grounded substrate, which is at a lower potential for holes than the drain. Holes being swept into the substrate 6 is coincident with the generation of electrons, and these electrons are swept across the space charge depletion layer from the substrate into the drain 8. This flow of holes into the substrate 6 and electrons into the drain 8 appears as a leakage current that is gate induced, or GIDL.

Another conventional protection circuit 3, shown in FIG. 2 is used to minimize the effects of GIDL. The protection circuit 3 differs from the protection circuit 2 in that the gate oxide 18 of the latter is replaced by a curved gate oxide 19. Since the gate oxide 19 is thicker at areas near the drain 8, the electric field between the drain and the gate 14 is reduced, and GIDL effects are minimized. This prior art circuit, however, still does not solve the problem of charge crowding at the area 2G of the drain 8 and the problems of localized heating and substrate breakdown stemming therefrom.

Due to the effects of charge crowding, conventional ESD circuits breakdown at a much lower ESD level than would be possible if charge crowding were eliminated.

SUMMARY OF THE INVENTION

In accordance with one aspect of the present invention, a protection device for an integrated circuit is provided. The protection device includes a substrate in which both a source region and a drain region are formed. The drain region includes an extended drain region having a doping level less than the drain region. In another embodiment, the source region also includes an extended region having a lower doping level than the source region in itself.

In accordance with another aspect of the present invention, a protection device is provided that includes a substrate having a pad contact, including an inner and outer region, and a rail contact. The outer region of the pad contact has a lower doping concentration that the inner region. The rail contact may also include separate regions of high and low doping. Additionally, a deep oxide is formed within the substrate, separating the pad contact from the rail contact. In a related aspect of the invention, the substrate further includes a buried layer of opposite doping type below both the pad and contact regions.

BRIEF DESCRIPTION OF THE DRAWINGS

FIGS. 7A1–7F are cross-sectional views of a substrate showing different steps for producing the electrostatic discharge protection circuit of FIG. 3.

DETAILED DESCRIPTION OF THE INVENTION

Figure 3:
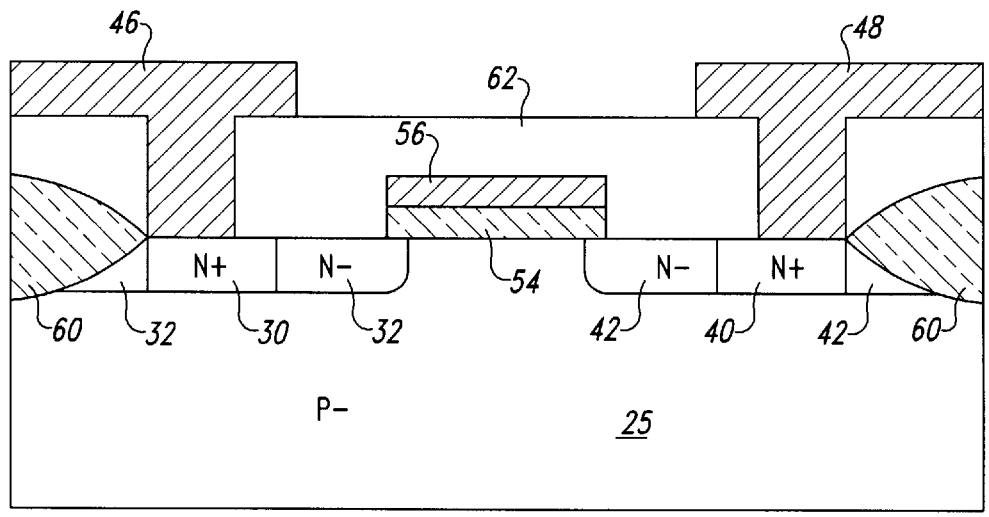
FIG. 3 is a cross sectional view of an electrostatic discharge protection circuit according to an embodiment of the present invention.

FIG. 3 is a cross sectional view of an ESD protection circuit 22 formed within an integrated circuit according to an embodiment of the present invention. Within a P-type substrate 25 is formed a drain 30 surrounded by a drain extension 32 and a source 40 preferably surrounded by a source extension 42. The drain extension 32 has a lower doping level than the drain 30. Similarly, the source extension 42 has a lower doping level than the source 40. Although not essential, it is preferred to include the source extension 42, as explained below. A drain lead 46 couples the drain 32 to a bonding pad (not shown) and a source lead 48 couples the source 40 to a ground plane. Also not shown is the circuit to be protected, such as an output buffer, also coupled to the bonding pad. In an alternative embodiment, the source lead 48 couples the source 40 to a Vcc plane. Portions of both the drain extension 32 and source extension 42 are covered by a gate oxide layer 54 and a gate 56. The drain and source extensions 32 and 42 are laterally bounded by field oxide regions 60 and covered by an insulation layer 62. The source lead 48 and the gate 56 are preferably all coupled to the ground, and in some embodiments the substrate 25 is also coupled to ground. Although shown formed in a P-type substrate 6, another embodiment of the invention could be formed in an N-type substrate by switching the dopant types of the substrate and components as is known in the art.

The operation of the protection circuit 22 during a positive ESD event will now be explained with reference to FIG. 3. A rising voltage travels from a pin through the drain lead 46 and increases until a trigger voltage level of the protection circuit 22 is reached. When the trigger voltage is reached, avalanche breakdown causes charge to flow from the drain 30 and the drain extension 32 into the substrate 25. Since the drain extension 32 has a lower doping level than the drain 30, more resistance is presented to the current traveling through that portion. Consequently, the more resistive drain extension 32 channels more charge to flow from the drain 30 into the substrate 25, and thus less charge flows from the drain extension 32 into the substrate 25.

Charge crowding is minimized in the structure shown in protection circuit 22. This minimization occurs because there is no highly-doped curved area attached to the drain area 30. The only curved area coupled to the drain lead 46 is the drain extension 32. Although the drain extension 32 has a curved portion, the drain extension is more resistive than the drain 30 due to its lower doping profile. Because of this increased resistance, the electric field at the curved areas of the drain extension 32 is much lower than at the curved area 20 of FIG. 1. Consequently, charge flowing out of the drain 30 travels a fairly uniform path along the bottom surface of the drain area 30 rather than through the charge-crowded curved area 20 of the prior art. Although the total amount of current is the same or greater than in the prior art, this current is spread out over a much larger surface area than in the prior art protection circuit 2. This increased surface area eliminates charge crowding and its detrimental affects, such as increased localized heating and destruction of the substrate. Because the current is discharged along the entire bottom surface of the drain 30 rather than the curved area 20 having a high electric field of the prior art, more current can be carried by the protection circuit 22 than the protection circuit 2 of the prior art. Thus, the protection circuit 22 is able to withstand a larger ESD, and therefore provides better protection to the integrated circuit than was previously available.

Another affect of the drain extension 32 and the source extension 42 having a lower doping than the drain 30 and the source 40 regards junction breakdown voltage. Junction breakdown voltage is a function, among other things, of dopant concentration. Lower doping concentrations result in a higher breakdown voltage, and higher doping concentrations have lower breakdown voltages. With reference to FIG. 3, the drain 30, because it contains higher dopant concentrations, will break down at a lower voltage than the drain extension 32. For example, when an ESD event occurs, the drain 30 will break down first, and charge will flow from the drain 30 into the substrate 25 before charge would flow from the drain extension 32 into the substrate 25. Similarly, charge will flow from the substrate 25 into the source 40 before flowing into the source extension 42 because of the higher doping of the source 40. Thus, increasing the junction breakdown voltage of areas surrounding the drain 30 and the source 40 is an additional way to ensure the bulk of an ESD event is borne by the desired portions of the protection circuit 22.

Additionally, it is preferable to include the source extension 42 due to defects that occur in the silicon adjacent to oxide areas. At junctions between silicon and oxide, for example where the field oxide region 60 meets the source extension 42, a high concentration of defects in the crystalline structure of silicon exists. These defective areas are particularly susceptible to damage from an ESD. By including the source extension 42, more current due to an ESD flows through the source 40, that has a fairly uniform crystalline structure, than flows through the source extension 42, that has a defective crystalline structure, as described above. By redirecting current through a more uniform area of the protection circuit 22, the protection circuit can prevent damage to the circuit it is protecting from a higher level of ESD than would be possible had the source extension 42 not been included within the protection circuit.

Figure 4:
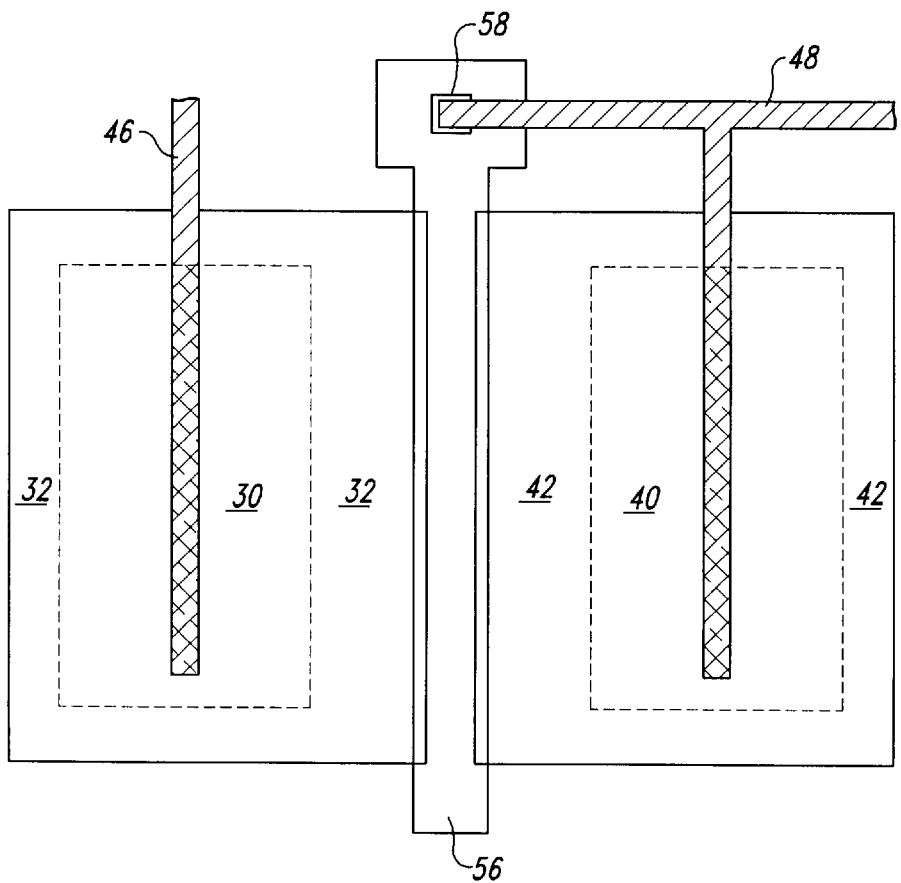
FIG. 4 is a top plan view of the electrostatic discharge protection circuit of FIG. 3.

FIG. 4 shows top plan view showing the layout of the protection circuit 22 of FIG. 3. The drain lead 46 and the source lead 48 are plainly visible. The source lead 48 connects to the gate 56 at a contact 58. Also shown in FIG. 4 are the highly doped drain 30, the lower doped drain extension 32, the highly-doped source 40, and the lower doped source extension 42. As can be seen from FIG. 4, the structure is similar to a standard MOS transistor which can be made without any additional steps over those used to produce a conventional MOS integrated circuit.

Figure 5:
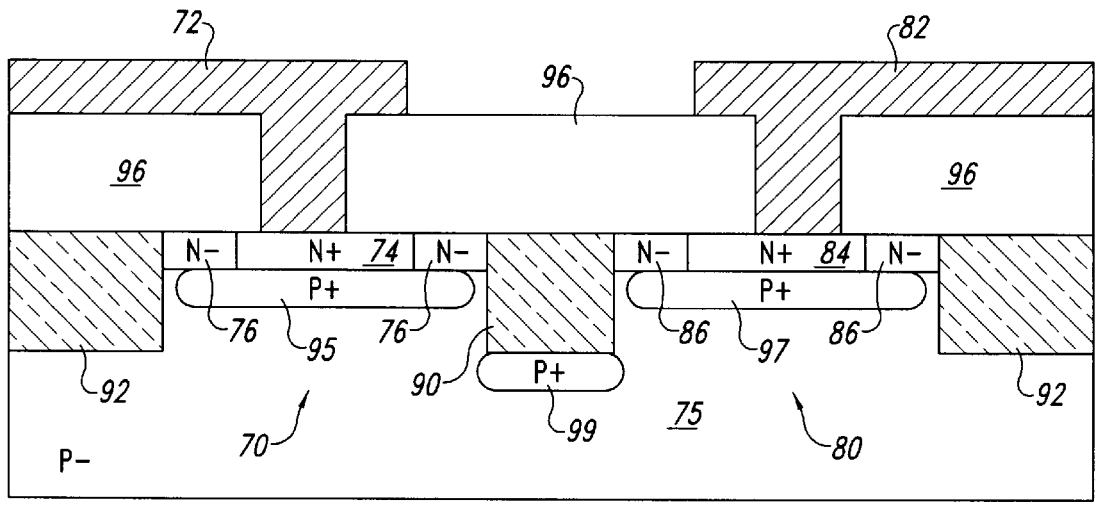
FIG. 5 is a cross sectional view of an electrostatic discharge protection circuit according to another embodiment of the present invention.
Figure 6:
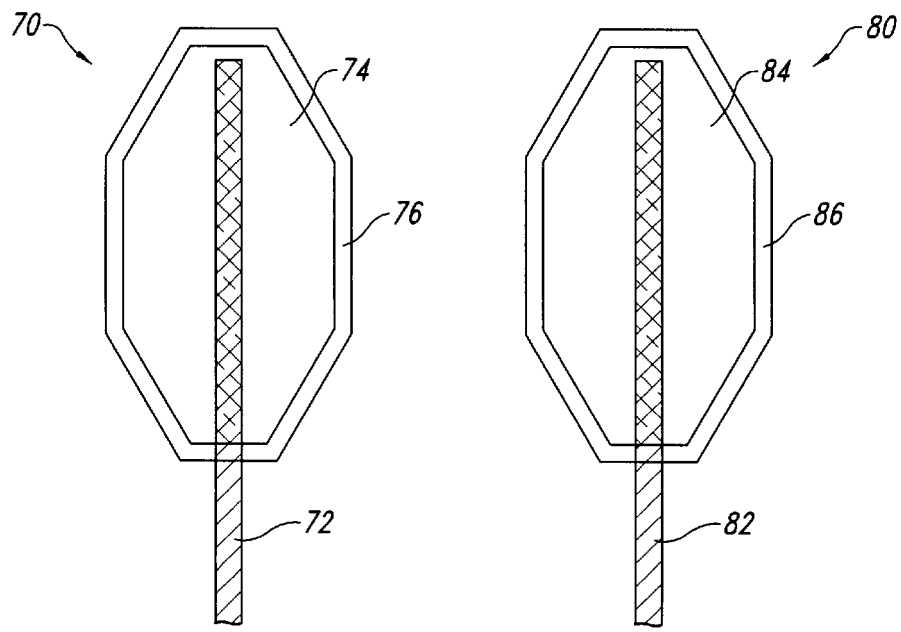
FIG. 6 is a top plan view of the electrostatic discharge protection circuit of FIG. 5.

FIG. 5 is a cross-sectional view of another embodiment of an ESD protection circuit 64 according to the present invention. The ESD protection circuit 64 operates in a manner similar to that of the protection circuit 22 of FIG. 3, but is made of different components. A pad contact 70, formed where a pad lead 72 is coupled to a substrate 75, is also coupled to a bonding pad (not shown). The bonding pad is also coupled to the circuit to be protected (not shown). A rail contact is formed where a plane lead 82 couples the substrate 75 to the ground plane or Vcc plane. In the pad contact 70, a highly-doped inner pad 74 is encircled by a lower doped outer pad 76. This is also seen in FIG. 6, which shows the layout of the protection circuit 64 of FIG. 5 in a top plan view. A similar structure is shown for the rail contact 80 where a highly doped inner pad 84 is preferably surrounded by a lower doped outer pad 86. The pad contact 70 and the rail contact 80 are separated by a shallow trench isolation oxide 90 and laterally bounded by a pair of shallow trench oxide regions 92. A Borophosphosilicate glass (BPSG) or another insulating and planarizing layer 96 is formed above the protection circuit 64. The BPSG layer partially covers the pad contact 70 and the rail contact 80. In a preferred embodiment, areas 95, 97, 99 have a doping type of the same kind as the substrate 75, but in a higher concentration. These areas of high doping are located adjacent to, respectively, the pad contact 70, the rail contact 80 and the isolation oxide 90. The embodiment of FIG. 5 is shown with the substrate 75 having a P-type and the contacts 70 and 80 having an N-type. Although, another embodiment of this invention can be made in an N-type substrate by switching the dopant types of the substrate and components as is known in the art.

The protection circuit 64 operates in a similar manner to the protection circuit 22 of FIG. 3, i.e., in a manner like a bipolar transistor. During a positive ESD, when the potential at the bonding pad increases so that a trigger voltage of the protection circuit 64 is reached, current is carried between the pads 74, 76 and the substrate 75 in an effort to equalize the electrostatic potential. As described above, this current is carried by avalanche breakdown of the PN junction between the substrate 75 and the inner pad 74 when this junction is highly reverse-biased. Because of its increased resistance, the lower doped outer pad 76 prevents charge crowding by using the reduced electric field to direct current through the higher doped inner pad 74, as described above. Thus, the current from the ESD is discharged along the entire bottom edge of the highly doped inner pad 74 into the substrate 75 or the doped area 95, and no charge crowding occurs. As before, the current flowing into the substrate 75 causes the substrate voltage to increase and eventually forward bias and turn-on the PN junction between the substrate 75 and the inner pad 84. Once fully turned on, the NPN transistor of the inner pad 74, substrate 75, and inner pad 84 carries current from the pad lead 72 across the substrate 75 and into the plane lead 82 where it is distributed along the large ground or Vcc plane.

During a negative ESD, voltage applied to the pad lead 72 decreases with respect to the substrate 75 until the junction between the inner pad 74 and the substrate is forward biased. Once the junction is biased enough, charge to begins to flow from the substrate 75 out of the chip via the pad lead 72. As current flows from the substrate 75, the voltage level of the substrate decreases due its resistive nature and reverse-biases the junction between it and the inner pad 84. Electrons from the pad lead 72 enter the inner pad 74 and are injected into the substrate, where a few of them recombine with the holes in the substrate. most of the electrons will diffuse through the substrate toward the rail contact 80, which is reversed biased with respect to the substrate 75. This reverse bias creates a large space charge depletion region. When diffused electrons reached the boundary of the space charge depletion region, they are swept across it to an inner pad 84 and eventually are carried into the ground plane by the plane lead 82. Thus, the NPN transistor, during a negative ESD, conducts current from the ground plane, through the substrate, and into the pad contact. If the space charge depletion region between the substrate 75 and the inner pad 84 is large enough, the electric field across the depletion region accelerates the electrons to a high enough energy that they can strike and dislodge some atomic electronics in the crystalline silicon, creating an electron-hole pair. These new electrons are also swept into the inner pad 84 and the holes swept into the substrate, adding to the already present current. The current continues to flow between the pad contact 70 and the rail contact 80 throughout the duration of the ESD.

In a preferred embodiment, the doping levels of the pad contact 70 and the rail contact 80 are the same. This gives the chip manufacturer the option of coupling either contact to the pad and the other to the rail. By making these contacts with the same concentration, their use is not determined by their design, but rather by the needs of the manufacturer.

As before, the lightly doped outer pad 86 is not necessary for the invention, but is included in the preferred embodiment. Both sides of the rail contact 80 are laterally bounded by the isolation oxide 90 and the trench oxide 92. As described above, the silicon crystal has a high level of defects in areas where it abuts an oxide layer. The outer pad 86 directs the highest areas of current density away from these defective areas.

Another embodiment of the present invention utilizes a set of buried layers 95, 97, 99 to adjust the threshold voltage of the protection circuit 64. The buried layers 95, 97, 99 have a high doping level of the opposite type then the highly-doped inner pads 74 and 84. By adjusting the doping levels of the buried layers 95, 97, 99, the voltage at which avalanche breakdown occurs between the inner pad 74 and the substrate 75 or between the outer pad 84 and the substrate can be pre-determined. By selecting the threshold voltage at a level below that which causes damage in the rest of the integrated circuit, the integrated circuit is protected from an ESD event. Additionally, the depth of the isolation oxide 90 can be chosen to facilitate the current flowing across the substrate 75. If the depth of the isolation oxide 90 is shallow enough, it creates a low-resistance path through the areas 95, 97, 99 to carry the current flowing through the substrate 75.

Steps that can be used to make the protection circuit 22 shown in FIG. 3 are shown in FIGS. 7A1–7F. Shown in FIG. 7A1, a masking layer 110 is formed on the lightly doped P-type substrate 25. An opening 112 defines the area where the drain 30 and the extended drain 32 will be formed. Similarly, an opening 114 defines where the source 40 and the extended source 42 will be formed.

Figure 2:
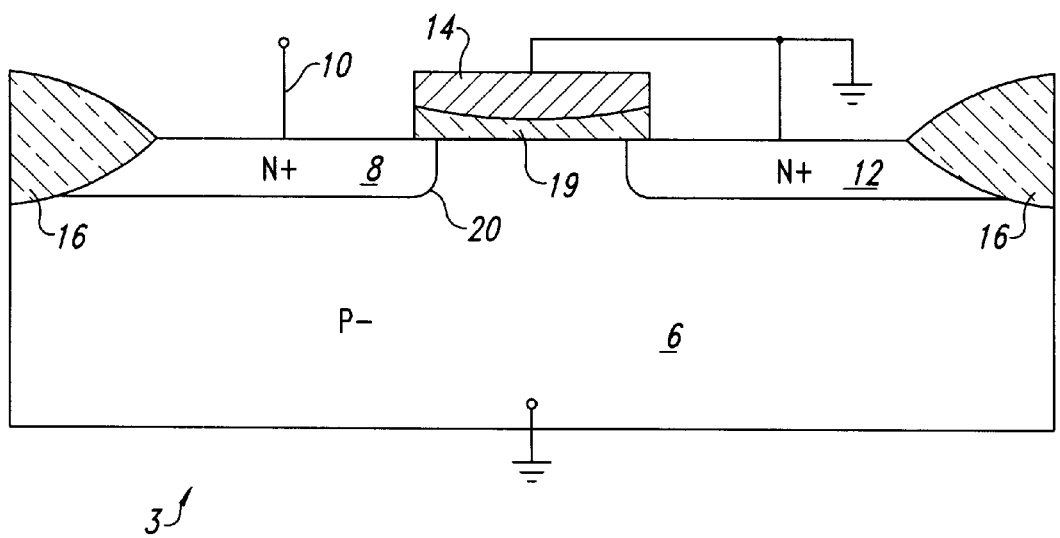
FIG. 2 is a cross sectional view of a portion of an integrated circuit containing a conventional electrostatic discharge protection circuit.
Figures 1, 7A:
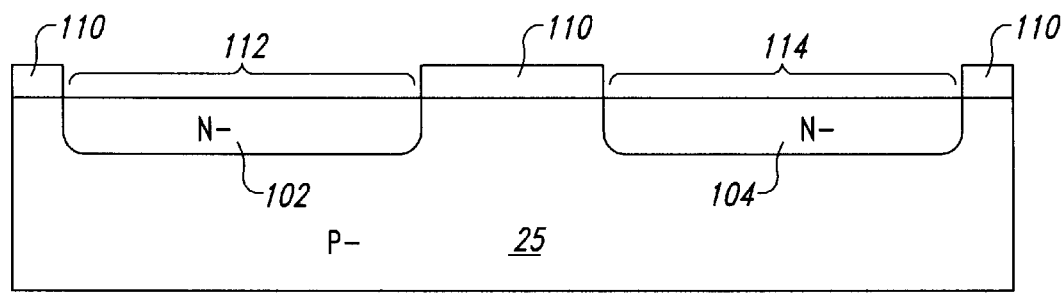
Figures 2, 7A:
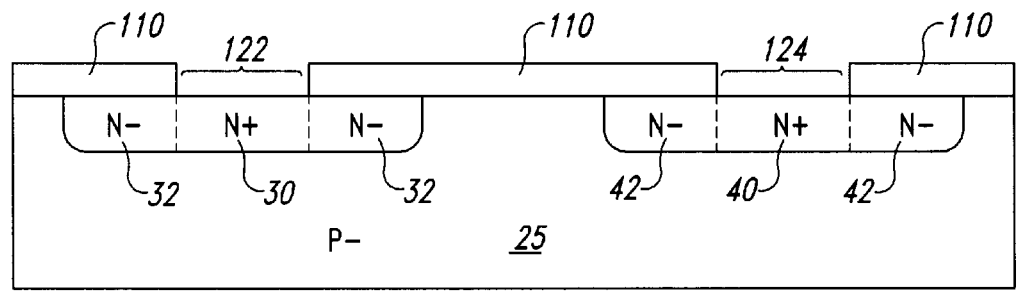

A dopant is then introduced into the substrate 25 at the openings 112 and 114 by a system such as chemical vapor deposition (CVD) or ion implantation. The dopant used is an N-type dopant, such as Arsenic or Phosphorous, having a light doping, and creates a pair of intermediate areas 102 and 104, part of which will become the drain extension 32 and the source extension 42. One embodiment uses a Phosphorous dopant at a dose of $3 \times 10^{15}/cm^2$ at an energy of 20–30 Kev. In FIG. 7A2, an additional area of the substrate 25 is covered by the masking layer 110. An opening 122 exposes the area above what will become the drain 30 and an opening 124 exposes an area above what will become the source 40. Another CVD or ion implantation occurs, only in portions of the areas 102 and 104 exposed by the openings 122, 124 of the masking layer 110. One embodiment uses an Arsenic dopant or a dose of $4 \times 10^{15}/cm^2$ at an energy of 30 Kev to produce the drain 30 and the source 40. This step completes the creation of the drain 30 and the extended drain 32, as well as the source 40 and the extended source 42.

Figure 1:
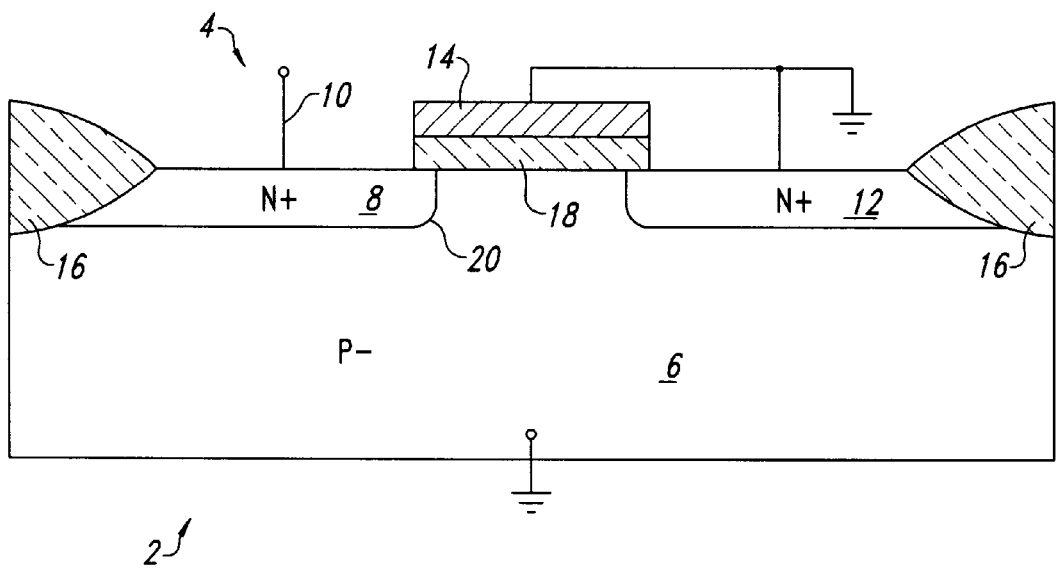
FIG. 1 is a cross sectional view of a portion of an integrated circuit containing a conventional electrostatic discharge protection circuit.
Figures 1, 7B:
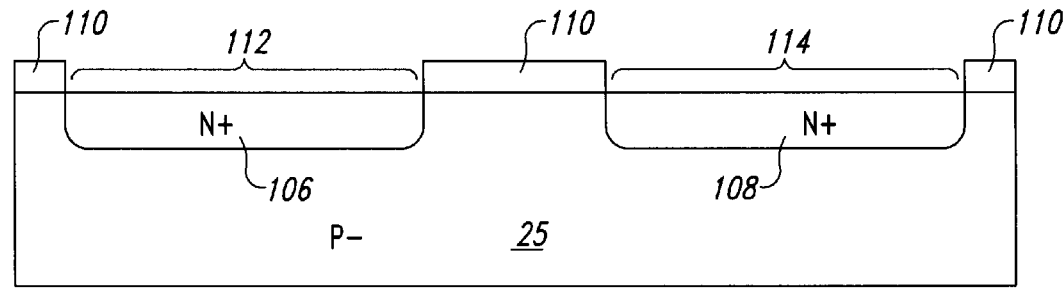
Figures 2, 7B:
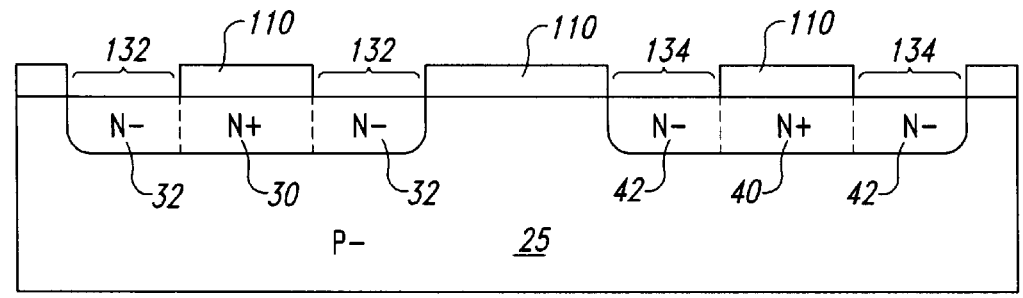

An alternative method to create the structure shown in FIG. 7A2 is shown in FIGS. 7B1 and 7B2. With respect to FIG. 7B1, a pair of the intermediate areas 106 and 108 are initially subject to a higher N+ doping through the openings 112 and 114. This gives the doping level needed for the drain 30 and source 40. Later, as shown in FIG. 7B2, a pair of openings 132 and a pair of openings 134 are formed in the masking layer 110 and the areas 106 and 108 are subject to an implantation of a P-type dopant, such as Boron. The Boron reacts with the N+ dopant in the areas 32 and 42, recombining and converting these portions of the highly-doped N+ areas 106 and 108 into N–areas. Either method shown in FIGS. 7A1–7A2 or 7B1–7B2 may be used to create the drain 30, drain extension 32, source 40 and source extension 42.

Figure 7C:
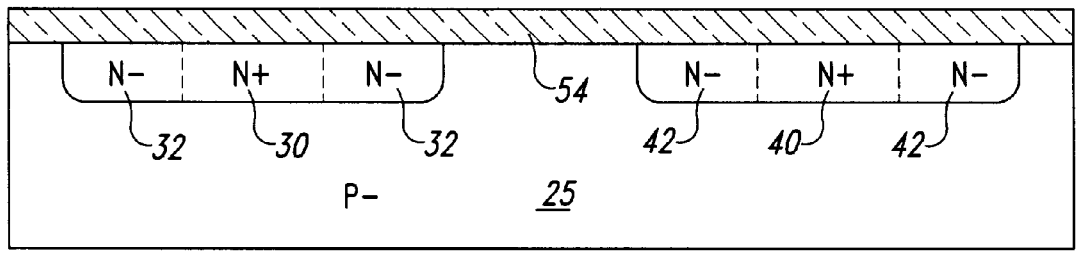
Figure 7D:
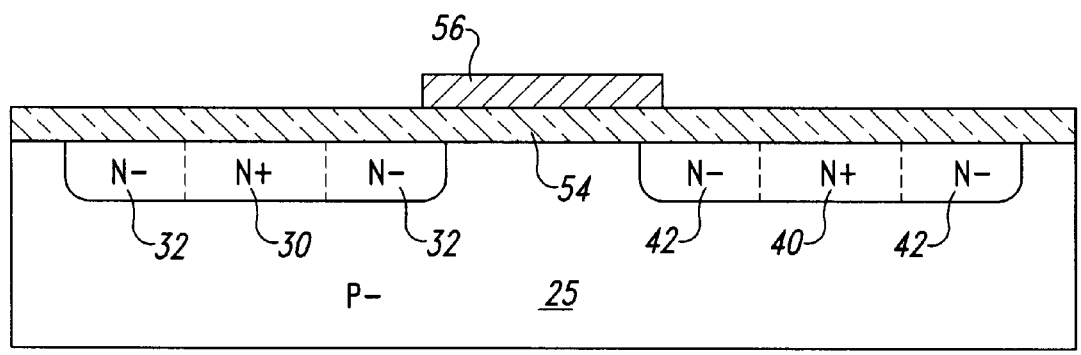
Figure 7E:
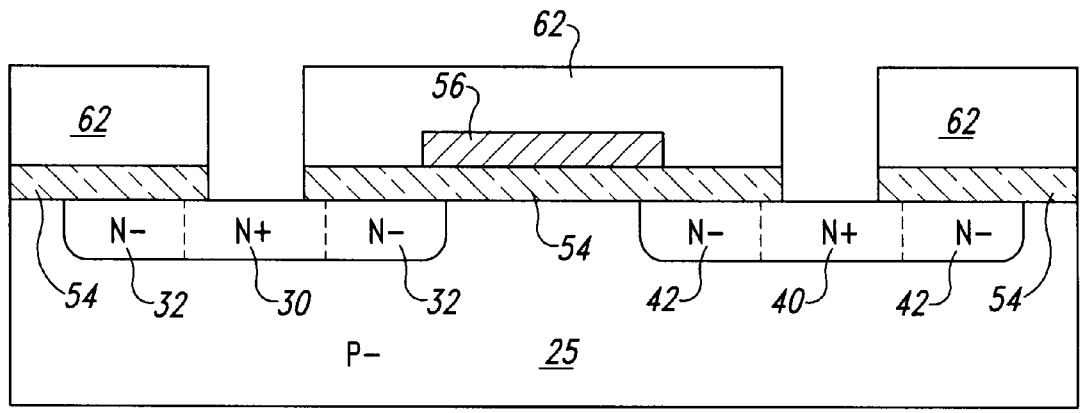
Figure 7F:
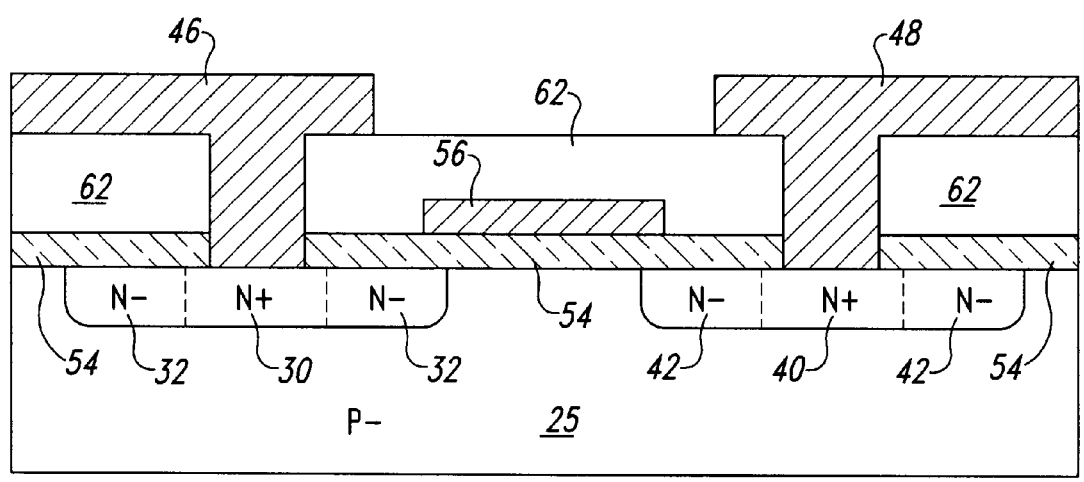

In FIG. 7C, shown is a gate oxide 54 grown using a strip and region process on the substrate 25. The polysilicon gate 56 is formed above the gate oxide 54 as shown in FIG. 7D. In FIG. 7E, a BPSG layer is shown after having been deposited and etched. This BPSG layer encapsulates the gate 56 and gate oxide 54, but has openings above the drain 30 and the source 40. Finally, as shown in FIG. 7F, metal contacts are deposited to become the drain lead 46 and the source lead 48.

Figure 8A:
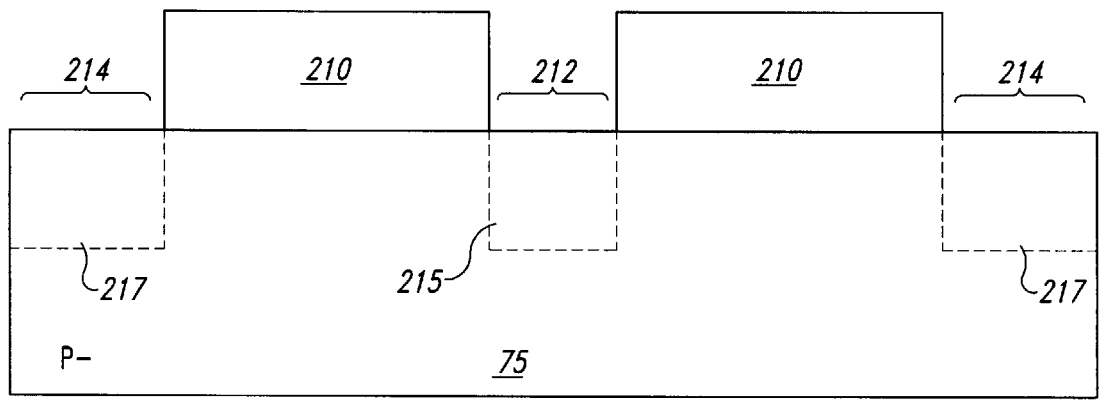
FIGS. 8A–8F are cross-sectional views of a substrate showing different steps for producing the electrostatic discharge protection circuit of FIG. 5.

Steps that can be used to make the protection circuit 64 shown in FIG. 5 are illustrated in FIGS. 8A–8F. In FIG. 8A, a masking layer 210 is formed on the P-type substrate 75. An opening 212 defines the area where the isolation oxide 90 will be formed and a pair of openings 214 define where the shallow trench oxide regions 92 will be formed.

The substrate 75 is then anisotropically etched, forming respectively, trenches 215 and 217 below the openings 212 and 214. Once formed, the trench 215 is filled with silicon dioxide by a deposition means. Of course, other ways to form an oxide, such as LOCOS can be used.

Figure 8B:
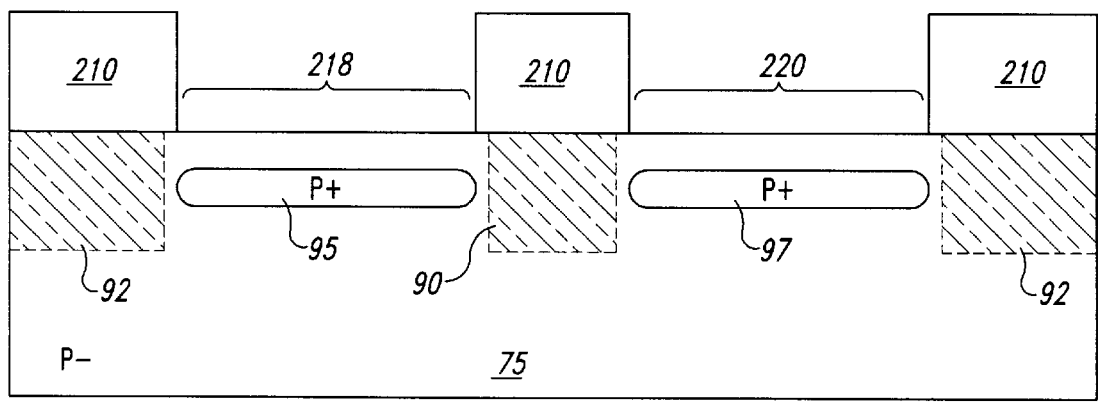
Figure 8C:
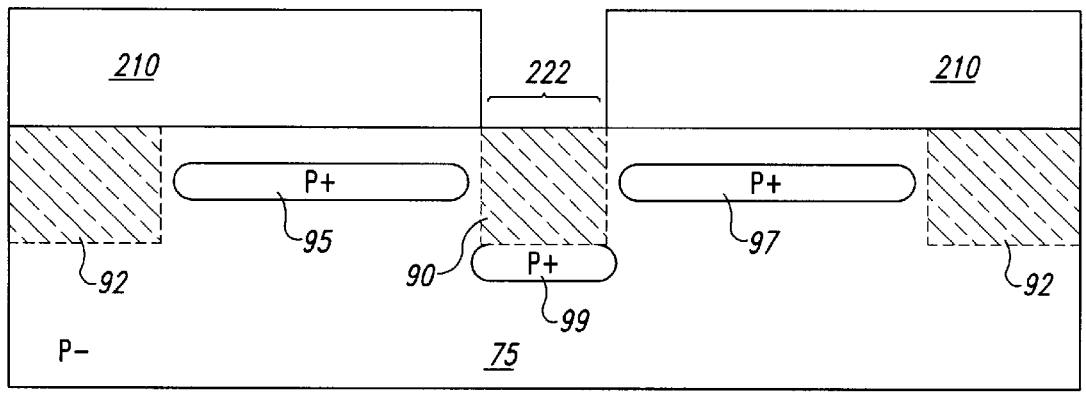

As shown in FIG. 8B, two openings 218 and 220 are formed in the masking layer 210. A medium strength ion implantation of Boron or other P-type dopant is performed through these openings. This step forms the buried layers 95 and 97. The implantation energy is high enough such that there are areas of undoped silicon above the buried layers 95 and 97. In FIG. 8C an opening 222 is formed in the masking layer 210. A high energy implantation step is performed implanting Boron through the isolation oxide 90 and into the substrate 75, forming another buried layer 99. Ten steps shown in FIGS. 8B and 8C are not order-specific.

Figure 8D:
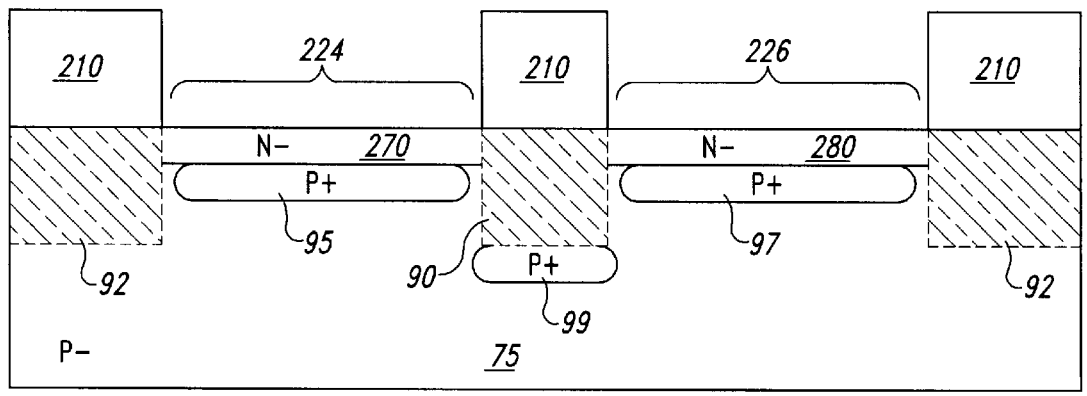
Figure 8E:
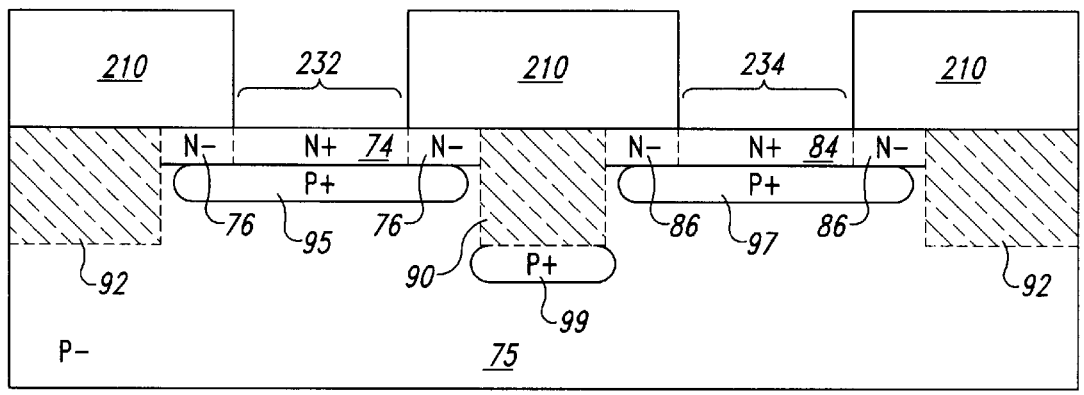
Figure 8F:
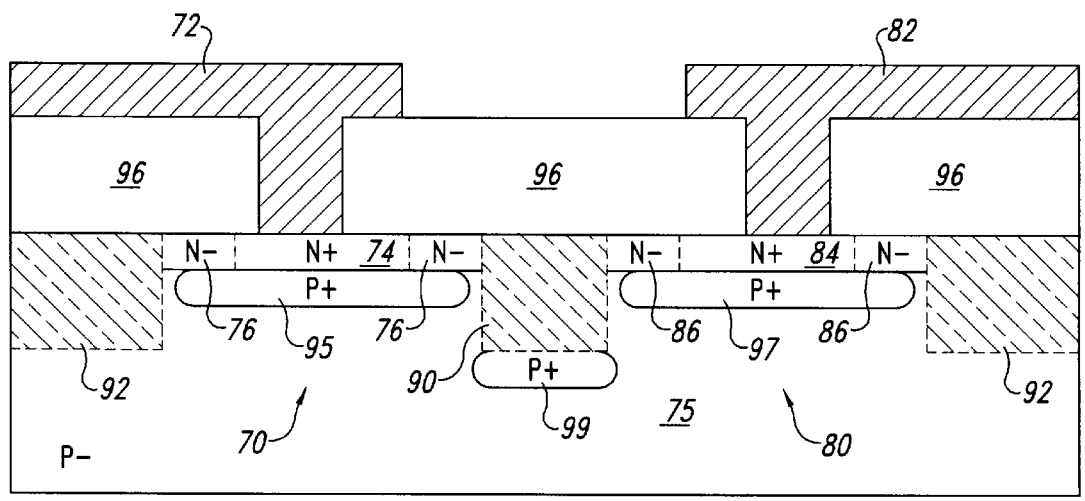

As shown in FIG. 8D, openings 224 and 226 are made in the masking layer 210. A low energy implant of an N-type dopant, such as Arsenic or Phosphorus, is performed through the openings 224 and 226. This implant creates a pair of intermediate doped areas 270 and 280 above the buried layers 95 and 97. Shown in FIG. 8E, openings 232 and 234 are made in the masking layer 210. Through these openings, another low energy ion implantation using additional N-type dopant is performed into the inner pads 74 and 84. This step creates the highly dope inner pads 74 and 84 while leaving the lower doped and outer pads 76 and 86 at the same doping levels as the intermediate areas 270 and 280. The inner pads 74 and 84 are respectively located above the buried layers 95 and 97. Of course, as described above, the pads 74, 76 and 84, 86 could be made by implanting the entire areas 270 and 280 within an N+ type dopant, followed by a P-type implantation only in the areas 76 and 86. Finally, as shown in FIG. 8F, is the protection circuit 64 following the addition of a BPSG layer and the pad and plane leads, 72 and 82.

Figure 9:
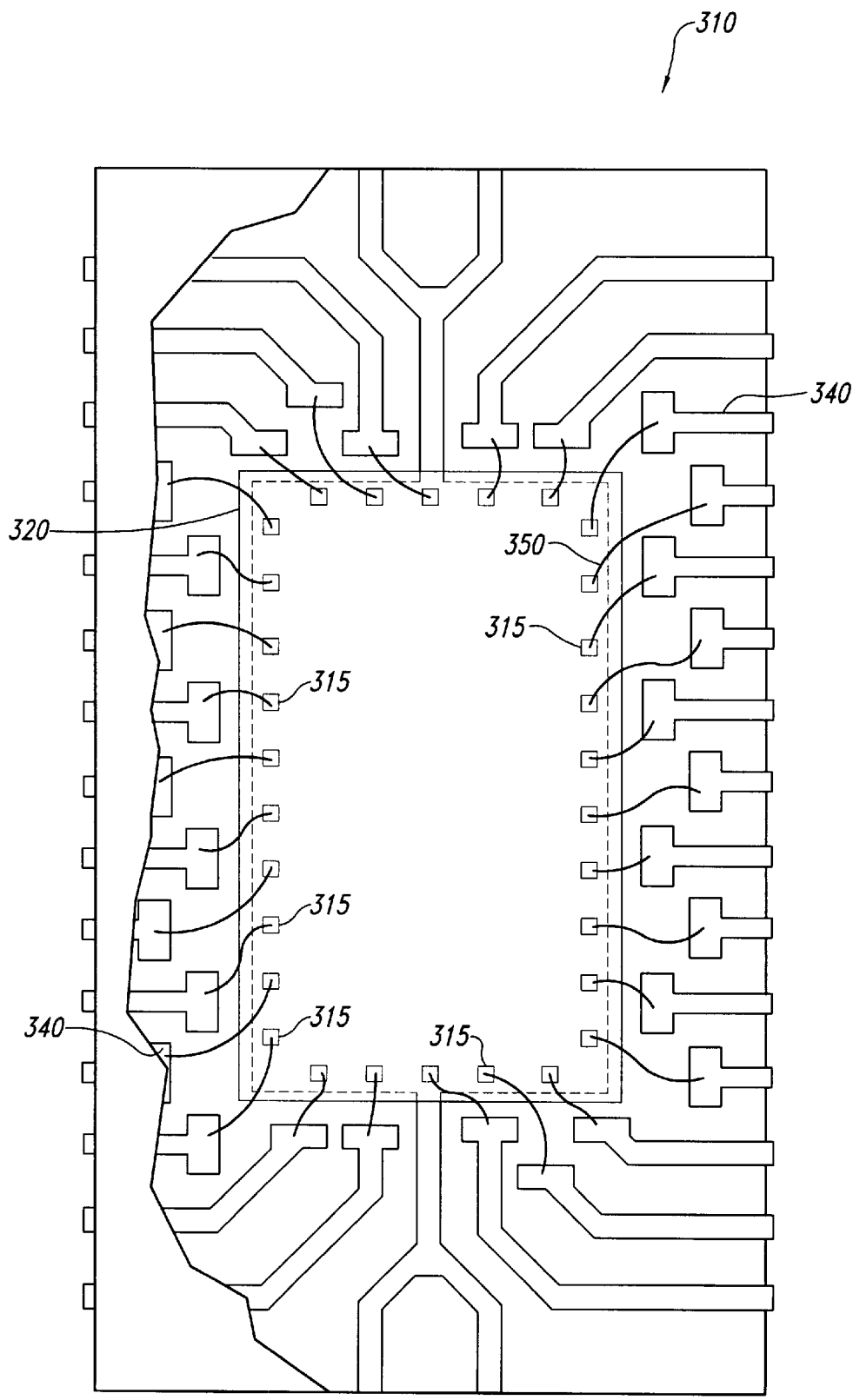
FIG. 9 is an isometric view showing a dual in-line package that includes a memory chip containing protection circuits of the present invention.

FIG. 9 shows a memory chip 320 shown mounted in a dual in-line package (DIP) 310. A number of bonding pads 315 are shown. Each bonding pad 315 is coupled to a terminal or pin 340 coupling one of the output pads 315 to the exterior of the DIP 310. Each of the bonding pads 315 are coupled to a respective pin 340 via a connection wire 350.

Each bonding pad 315 is coupled to one of the protection circuits 22 or 64 according to the present invention. Any ESD is carried through one or more of the pins 340 to its respective bonding pad 315. Once the voltage of the bonding pad 315 reaches the trigger voltage of the protection circuit 22 or 64, current is carried away from pins 340 and into the ground or Vcc plane, thereby protecting the memory chip from damage due to the ESD.

What is claimed is:

1. A method of forming a protection device, comprising:
    forming an outer pad ring of a first conductivity at a first concentration in a substrate of a second conductivity;
    forming an inner pad ring of the first conductivity at a second concentration into the substrate within the outer pad ring, the second concentration higher than the first concentration, the inner pad ring abutting the substrate of a second conductivity;
    forming a rail contact of the first conductivity at a third concentration in the substrate; the rail contact being formed by forming an outer rail ring of the first conductivity at the third concentration in the substrate and forming an inner rail ring of the first conductivity at a fourth concentration in the substrate within the outer rail ring, the fourth concentration higher than the third concentration, the inner rail ring abutting the substrate of a second conductivity;
    forming a separation structure in the substrate between the outer pad ring and the outer rail ring;
    coupling the inner pad ring to a first portion of the device; and
    coupling the rail contact to a second portion of the device.

2. The method of claim 1, further comprising implanting a buried layer beneath the separation structure.

3. A method of forming a protection device, comprising:
    forming an outer pad ring of a first conductivity at a first concentration in a substrate of a second conductivity at a first concentration;
    forming an inner pad ring of the first conductivity at a second concentration into the substrate within the outer pad ring, the second concentration higher than the first concentration;
    forming a rail contact of the first conductivity at a third concentration in the substrate;
    implanting a buried layer of the second conductivity at a second concentration beneath the inner pad ring and implanting a second buried layer of the second conductivity at a second concentration beneath the rail contact, the second concentration higher than the first concentration;
    coupling the inner pad ring to a first portion of the device; and
    coupling the rail contact to a second portion of the device.

4. A method of forming a protection device to protect an integrated circuit from an electrostatic discharge, the method comprising:
    forming, in a substrate having a first conductivity type, a pad ring structure having an inner pad ring and an outer pad ring, both the inner and outer pad rings having a second conductivity type but having different concentration levels of dopant;
    forming, in the substrate, a rail ring structure having an inner rail ring and an outer rail ring, both the inner and outer rail rings formed by the second conductivity type but having different concentration levels of dopant;
    implanting a buried layer of the first conductivity type beneath the inner pad ring and implanting a second buried layer of the first conductivity type beneath the inner rail ring, the buried layers having a doping level higher than that of the substrate;
    coupling the inner pad ring to a bonding pad; and
    coupling the inner rail ring to a ground rail used by the integrated circuit.

5. The method of claim 4, further comprising:
    forming a separation structure in the substrate and between the outer pad ring and the outer rail ring.

6. The method of claim 5, further comprising implanting a buried layer beneath the separation structure.

7. A method of forming a protection device, comprising:
    forming an outer pad ring of a first conductivity at a first concentration in a substrate of a second conductivity at a first concentration;
    forming an inner pad ring of the first conductivity at a second concentration into the substrate within the outer pad ring, the second concentration higher than the first concentration;
    forming a rail contact of the first conductivity at a third concentration in the substrate; the rail contact being formed by forming an outer rail ring of the first conductivity at the third concentration in the substrate and forming an inner rail ring of the first conductivity at a fourth concentration in the substrate within the outer rail ring, the fourth concentration higher than the third concentration;
    forming a separation structure in the substrate between the outer pad ring and the outer rail ring;
    implanting a buried layer of the second conductivity at a second concentration beneath the inner pad ring and implanting a second buried layer of the second conductivity at a second concentration beneath the rail contact, the second concentration higher than the first concentration;
    coupling the inner pad ring to a first portion of the device; and
    coupling the rail contact to a second portion of the device.

8. The method of claim 7, further comprising implanting a buried layer of the second conductivity at the second concentration beneath the separation structure.

* * * * *